(12) United States Patent
Olgaard

(10) Patent No.: US 9,618,577 B2
(45) Date of Patent: Apr. 11, 2017

(54) SYSTEM AND METHOD FOR TESTING DATA PACKET TRANSCEIVERS HAVING VARIED PERFORMANCE CHARACTERISTICS AND REQUIREMENTS USING STANDARD TEST EQUIPMENT

(71) Applicant: LITEPOINT CORPORATION, Sunnyvale, CA (US)

(72) Inventor: Christian Volf Olgaard, Saratoga, CA (US)

(73) Assignee: LitePoint Corporation, Sunnyvale, CA (US)

(*) Notice: Subject to any disclaimer, the term of this patent is extended or adjusted under 35 U.S.C. 154(b) by 0 days.

(21) Appl. No.: 14/147,159

(22) Filed: Jan. 3, 2014

(65) Prior Publication Data

US 2015/0192639 A1    Jul. 9, 2015

(51) Int. Cl.
| | | |
|---|---|---|
| *G01R 31/28* | (2006.01) | |
| *G01R 31/3177* | (2006.01) | |
| *H04B 10/00* | (2013.01) | |
| *G01M 11/00* | (2006.01) | |
| *H04B 10/073* | (2013.01) | |

(52) U.S. Cl.
CPC ......... *G01R 31/3177* (2013.01); *G01M 11/00* (2013.01); *H04B 10/00* (2013.01); *H04B 10/0731* (2013.01)

(58) Field of Classification Search
CPC ............................. H04B 10/00; G01R 31/3177
See application file for complete search history.

(56) References Cited

U.S. PATENT DOCUMENTS

| | | |
|---|---|---|
| 5,335,010 A | 8/1994 | Lindemeier et al. |
| 5,337,316 A | 8/1994 | Weiss et al. |
| 5,481,186 A | 1/1996 | Heutmaker et al. |

(Continued)

FOREIGN PATENT DOCUMENTS

KR    10-2007-0030052 A    3/2007

OTHER PUBLICATIONS

International Search Report and Written Opinion, filed in PCT/US2014/070480 issued on Mar. 18, 2015, 9 pages.

(Continued)

*Primary Examiner* — Guy Lamarre
(74) *Attorney, Agent, or Firm* — Banner & Witcoff, Ltd.

(57) ABSTRACT

A system and method for testing a wireless data packet signal transceiver device under test (DUT) by using DUT control circuitry separate from a tester to access and execute test program instructions for controlling the DUT during testing with the tester. The test program instructions can be provided previously and stored for subsequent access and execution under control of the tester or an external control source, such a personal computer. Alternatively, the test program instructions can be provided by the tester or external control source immediately prior to testing, such as when beginning testing of a DUT with new or different performance characteristics or requirements. Accordingly, specialized testing of different DUTs while accounting for differences among various chipsets employed by the DUTs can be performed in coordination with a standard tester configuration without need for reconfiguring or reprogramming of the tester.

14 Claims, 2 Drawing Sheets

(56) References Cited

U.S. PATENT DOCUMENTS

| | | |
|---|---|---|
| 6,779,050 B2 | 8/2004 | Horton et al. |
| 6,914,944 B1 | 7/2005 | Nokkonen |
| 7,126,515 B1 | 10/2006 | Kris |
| 7,484,146 B2 | 1/2009 | Olgaard et al. |
| 7,539,489 B1 | 5/2009 | Alexander |
| 7,567,521 B2 | 7/2009 | Olgaard et al. |
| 7,689,213 B2 | 3/2010 | Olgaard et al. |
| 7,865,147 B2 | 1/2011 | Olgaard et al. |
| 7,962,823 B2 | 6/2011 | Olgaard |
| 8,131,223 B2 | 3/2012 | Olgaard |
| 8,885,483 B2 * | 11/2014 | Olgaard .................. H04L 43/50 370/241 |
| 2001/0010751 A1 | 8/2001 | Amino et al. |
| 2002/0031125 A1 | 3/2002 | Sato et al. |
| 2004/0203467 A1 | 10/2004 | Liu et al. |
| 2004/0264592 A1 * | 12/2004 | Sibecas .................. H01Q 21/24 375/267 |
| 2006/0128373 A1 | 6/2006 | Cochrane et al. |
| 2006/0183432 A1 | 8/2006 | Breslin et al. |
| 2006/0282247 A1 | 12/2006 | Brennan et al. |
| 2007/0002753 A1 | 1/2007 | Bailey |
| 2007/0070881 A1 * | 3/2007 | Olgaard et al. ............... 370/208 |
| 2007/0072599 A1 | 3/2007 | Romine et al. |
| 2007/0167155 A1 | 7/2007 | Ishidu |
| 2008/0026748 A1 | 1/2008 | Alexander |
| 2008/0285467 A1 | 11/2008 | Olgaard |
| 2008/0287117 A1 | 11/2008 | Olgaard |
| 2011/0103235 A1 | 5/2011 | Luong |
| 2011/0314333 A1 | 12/2011 | Olgaard |
| 2012/0257537 A1 * | 10/2012 | Lee ......................... H04L 41/26 370/254 |
| 2014/0365842 A1 * | 12/2014 | Li ......................... H03M 13/09 714/752 |

OTHER PUBLICATIONS

International Search Report and Written Opinion Dated Jun. 6, 2008 for PCT/US2007/067853.
International Search Report and Written Opinion Dated Sep. 18, 2008 for PCT/US2007/067856.
International Search Report and Written Opinion Dated Jun. 23, 2008 for PCT/US2008/056827.
International Search Report and Written Opinion Dated Nov. 24, 2008 for PCT/US2007/066211.
International Search Report and Written Opinion Dated Oct. 22, 2008 for PCT/US2008/072460.
International Search Report and Written Opinion Dated Oct. 30, 2008 for PCT/US2008/072462.
International Search Report and Written Opinion Dated Oct. 30, 2008 for PCT/US2008/072473.
U.S. Appl. No. 14/202,104, "System and Method for Testing a Radio Frequency Transceiver by Controlling Test Flow via an Induced Interrupt", filed Mar. 10, 2014; Olgaard, Christian Volf, et. al.

* cited by examiner

SYSTEM AND METHOD FOR TESTING DATA PACKET TRANSCEIVERS HAVING VARIED PERFORMANCE CHARACTERISTICS AND REQUIREMENTS USING STANDARD TEST EQUIPMENT

BACKGROUND

The present invention relates to testing data packet transceiver devices under test (DUTs), and in particular, to performing specialized testing of different DUTs while accounting for differences among various chipsets employed by the DUTs in coordination with a standard tester configuration without need for reconfiguring or reprogramming of the tester.

Many of today's electronic devices use wireless technologies for both connectivity and communications purposes. Because wireless devices transmit and receive electromagnetic energy, and because two or more wireless devices have the potential of interfering with the operations of one another by virtue of their signal frequencies and power spectral densities, these devices and their wireless technologies must adhere to various wireless technology standard specifications.

When designing such wireless devices, engineers take extra care to ensure that such devices will meet or exceed each of their included wireless technology prescribed standard-based specifications. Furthermore, when these devices are later being manufactured in quantity, they are tested to ensure that manufacturing defects will not cause improper operation, including their adherence to the included wireless technology standard-based specifications.

For testing these devices following their manufacture and assembly, current wireless device test systems employ a subsystem for analyzing signals received from each device. Such subsystems typically include at least a vector signal generator (VSG) for providing the source signals to be transmitted to the device under test, and a vector signal analyzer (VSA) for analyzing signals produced by the device under test. The production of test signals by the VSG and signal analysis performed by the VSA are generally programmable so as to allow each to be used for testing a variety of devices for adherence to a variety of wireless technology standards with differing frequency ranges, bandwidths and signal modulation characteristics.

As part of the manufacturing of wireless communication devices, one significant component of production cost is costs associated with manufacturing tests. Typically, there is a direct correlation between the cost of test and the sophistication of the test equipment required to perform the test. Thus, innovations that can preserve test accuracy while minimizing equipment costs (e.g., increasing costs due to increasing sophistication of necessary test equipment, or testers) are important and can provide significant costs savings, particularly in view of the large numbers of such devices being manufactured and tested.

Accordingly, it would be desirable to have techniques for testing increasingly sophisticated DUTs with increasingly varied performance characteristics and requirements without also requiring increasingly sophisticated testers with similarly increasingly varied testing characteristics and requirements.

SUMMARY

In accordance with the presently claimed invention, a system and method are provided for testing a wireless data packet signal transceiver device under test (DUT) by using DUT control circuitry separate from a tester to access and execute test program instructions for controlling the DUT during testing with the tester. The test program instructions can be provided previously and stored for subsequent access and execution under control of the tester or an external control source, such a personal computer. Alternatively, the test program instructions can be provided by the tester or external control source immediately prior to testing, such as when beginning testing of a DUT with new or different performance characteristics or requirements. Accordingly, specialized testing of different DUTs while accounting for differences among various chipsets employed by the DUTs can be performed in coordination with a standard tester configuration without need for reconfiguring or reprogramming of the tester.

In accordance with one embodiment of the presently claimed invention, a system for testing a wireless data packet signal transceiver device under test (DUT) includes: a data packet signal path for communicating with a DUT to convey a transmit data packet signal from the DUT and a receive data packet signal to the DUT; a tester coupled to the data packet signal path to receive the transmit data packet signal and provide the receive data packet signal, and responsive to one or more test commands by providing one or more test control signals; a DUT control signal interface for communicating with the DUT to convey at least one DUT control signal to the DUT; and DUT control circuitry coupled between the tester and the DUT control signal interface, responsive to at least the one or more test control signals by executing a plurality of test program operations to provide the at least one DUT control signal, wherein the transmit data packet signal is responsive to at least one of the receive data packet signal and the at least one DUT control signal.

In accordance with another embodiment of the presently claimed invention, a method of testing a wireless data packet signal transceiver device under test (DUT) includes: receiving, with a tester, a transmit data packet signal from a DUT; transmitting, with the tester, a receive data packet signal to the DUT; responding, with the tester, to one or more test commands by providing one or more test control signals; and responding, with DUT control circuitry, to at least the one or more test control signals by executing a plurality of test program operations to provide at least one DUT control signal to the DUT, wherein the transmit data packet signal is responsive to at least one of the receive data packet signal and the at least one DUT control signal.

DETAILED DESCRIPTION

Figure 1:
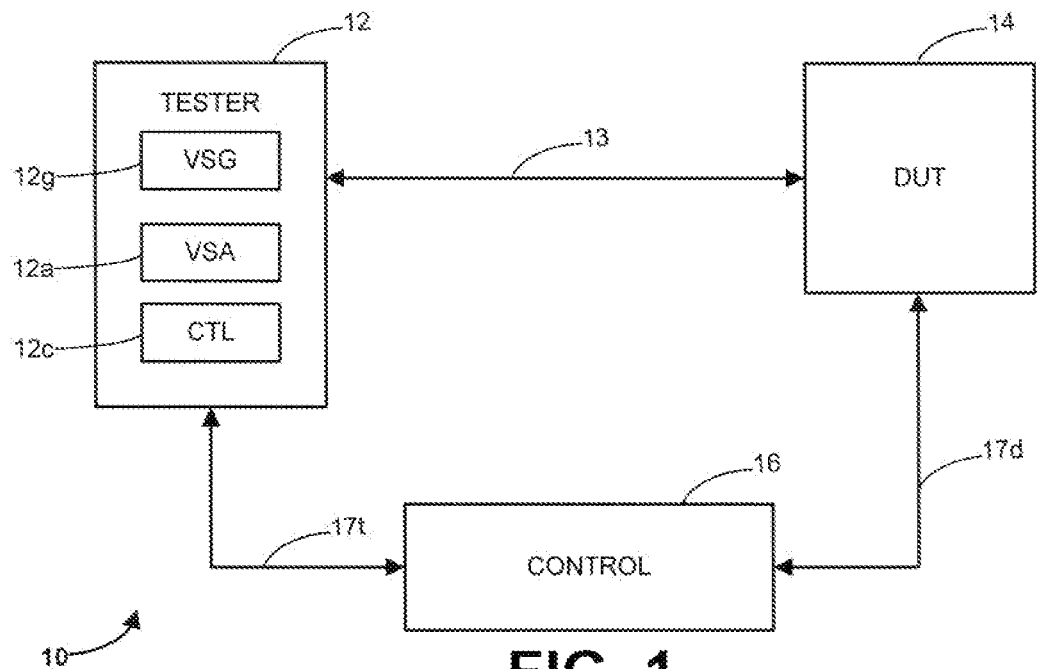
FIG. 1 depicts a conventional test environment for testing data packet transceivers.

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed. Moreover, to the extent that the figures illustrate diagrams of the functional blocks of various embodiments, the functional blocks are not necessarily indicative of the division between hardware circuitry.

As discussed in more detail below, in accordance with embodiments of the presently claimed invention, interaction between a tester and a DUT can be controlled in such a way as to reduce latency and necessary volume of communications between the tester and the DUT, thereby reducing test time and, therefore, costs associated with test time. For example, communications latency can be reduced by enabling the tester to more rapidly transition between signal transmission and signal reception modes of operation, while communications volume can be minimized by reducing the number of control commands needed to flow from the tester to the DUT.

One technique for minimizing interaction between a tester and DUT involves using a single command from the tester to initiate transaction of multiple, predetermined tester data packets until a predetermined number of such tester data packets have been transmitted. (This has been disclosed in detail in U.S. patent application Ser. Nos. 11/422,475, 11/422,489 and 11/696,921, the contents of which are incorporated herein by reference.) Another technique involves using a predetermined sequence of test steps known to both the DUT and the tester to reduce the need for commands to be exchanged between the DUT and tester. (This has been disclosed in detail in U.S. patent application Ser. Nos. 11/279,778, 11/839,814, 11/839,788 and 11/839,828, the contents of which are incorporated herein by reference.) However, these sequencing techniques involving multiple tester data packets and sequencing of test steps require support on the part of the tester or DUT, or both, such as additional hardware, firmware or software (e.g., additional programming of test commands). For example, to support these time saving test techniques, the DUT might require firmware that is specific to its processing subsystem (e.g., its particular chipset), and one or more manufacturers of the integrated circuits may be required to support these techniques with specific driver functions.

These difficulties, however, can be avoided with the presently claimed invention, which enables multiple test data packet and test step sequencing techniques to be used without requiring special provisions to the DUT, and in most cases, to the tester as well. In accordance with exemplary embodiments, an external processing subsystem is used to control the DUT in coordination with the tester. This external subsystem can be designed to accommodate a variety of DUTs and their associated chipsets to support multiple test data packet and test step sequencing techniques, while requiring no modifications to the hardware or firmware of the DUT.

Referring to FIG. 1, a conventional testing environment for testing a wireless data packet transceiver device under test (DUT) includes the tester 12, a DUT 14 (or, alternatively, multiple DUTs to be tested concurrently or sequentially, depending upon the tester configuration), and a controller 16 (e.g., a personal computer). As discussed above, a tester includes a data packet signal source 12g (typically in the form of a VSG) and a data packet signal receiver and analyzer 12a (typically in the form of a VSA). The tester can also include control circuitry 12c for performing various control functions in accordance with internally stored test programs or test commands or programs received from an external source (e.g., the controller 16).

The tester 12 and DUT 14 communicate via a signal path 13. This signal path 13 is typically in the form of a conductive radio frequency (RF) signal path, such as a coaxial cable and connectors. However, this signal path 13 can also be in the form of a radiative signal path, such as that formed by the use of RF antennas (not shown) connected to the signal ports of the tester 12 and DUT 14 for radiating and receiving electromagnetic signals in accordance with well-known principles.

The controller 16 provides testing instructions and receives test data from the tester 12 and DUT 14 via signal interfaces 17t, 17d, which are typically in the form of multiple-conductor cables.

As discussed above, such a testing environment can support sequencing of multiple test packets and test steps. However, as also discussed above, such support is achieved at the cost of modifications to hardware or firmware of at least the DUT 14, and, in some cases, to the tester 12 as well.

Figure 2:
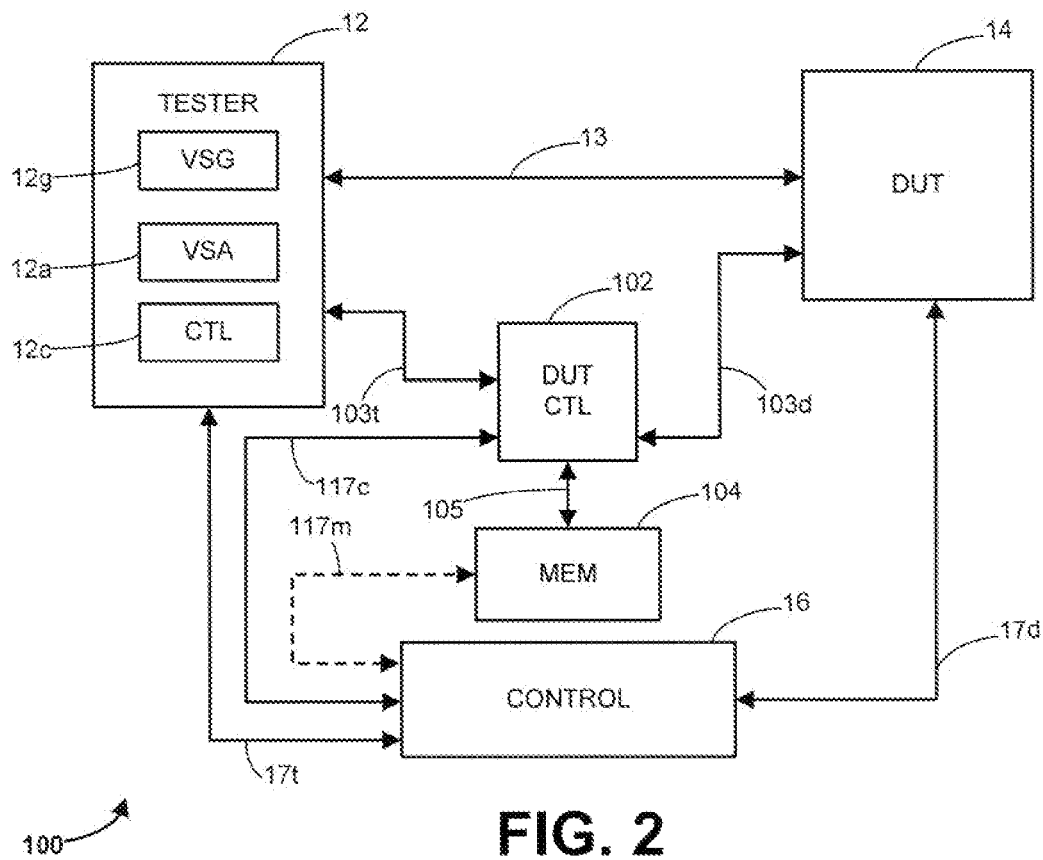
FIG. 2 depicts a test environment for testing data packet transceivers in accordance with exemplary embodiments of the presently claimed invention.

Referring to FIG. 2, a testing environment 100 in accordance with exemplary embodiments of the presently claimed invention includes an external subsystem 102, 104, which, as discussed above, operates in coordination with the tester 12 and includes any necessary hardware, firmware or software needed to support multiple test data packet and test step sequencing of the DUT 14 in accordance with the requirements of the DUT 14 chipset.

When testing the DUT 14, the tester 12 sends data packet signals to the DUT 14 via the signal path 13, and monitors responses received from the DUT 14, e.g., in the form of acknowledgment signals ("ACK") or other types of data packet signals. These responsive signals are received by the tester receiver circuitry 12a and analyzed, such as by measuring and comparing various physical signal characteristics (e.g., signal power, frequency, modulation type or bit-rate) against values specified in accordance with the signal standard in conformance with which the DUT 14 is designed to operate.

During such testing, coordination between the tester 12 and DUT 14 is necessary, and is typically done by issuing commands to the DUT 14 from the tester 12 (e.g., via the data packet signal interface 13) or in coordination with the tester 12, such as by providing instructions to the DUT 14 from the controller 16 via the control signal interface 17d. Accordingly, during a complete test sequence, numerous control commands will be required to be conveyed from the tester 12 or controller 16 to the DUT 14 during one or more time intervals in which no test measurements are performed by the tester 12 (with respect to data packet signals received from the DUT 14) but which nonetheless consume time. Hence, overall test time can be reduced if these times needed for control commands can be reduced in duration and/or number.

In general, reducing the number of control commands requires that one or more commands cover more than one testing event. For example, a typical command to the DUT 14 to prepare to receive a test data packet signal from the tester 12 covers one event, i.e., the sending of the test signal. A second command to query the DUT 14 as to whether the test signal was received correctly or not also covers one event. However, if the DUT 14 was pre-programmed to respond to a single command by receiving a predefined number of test data packets from the tester 12, and automatically confirming that such test data packets were correctly received, that single original command could cover a potentially extensive sequence of testing events.

As a further example, if the DUT 14 and tester 12 operated in accordance with a previously agreed upon sequence of test steps to execute and, upon synchronization, began executing those test steps until all test steps were completed, or one test step had timed out, then that initial exchange of synchronization signals could cover an entire testing sequence, including both receive (RX) and transmit (TX) testing (from the perspective of the DUT 14) with test signals having predetermined physical characteristics (e.g., frequency, power, modulation type, bit-rate, etc.). Alternatively, the tester 12 and DUT 14 can transmit or receive data packets from one another until a control or responsive signal is received by the transmitting unit from the receiving unit indicating completion of that set of test steps and signaling that the transmitting unit can proceed to the next predefined operation.

In accordance with exemplary embodiments of the presently claimed invention, the external subsystem 102 is provided (e.g., programmed) with programs specifically matched to the DUT 14 and its chipsets, thereby ensuring that the specific characteristics and capabilities of the DUT 14 can be tested adequately using time-saving testing techniques such as multiple test data packet and test step sequencing techniques. This advantageously avoids the need for special preparation or customization of the DUT 14, such as through expanded or customized hardware, firmware or modified or additional driver software. Accordingly, working in conjunction with the tester 12, it is this external processing subsystem 102 (e.g., a microcontroller), rather than the DUT 14, that is aware of and tasked with managing access to and execution of the test sequencing requirements. Hence, the testing speed and cost benefits of test sequencing can be achieved without requiring special preparations or modifications for the DUT 14 itself.

The DUT controller 102 communicates (e.g., by exchanging control signals acting as triggers or containing instructions or data) with the tester 12 via a control signal interface 103t. Similarly, the DUT controller 102 communicates (e.g., by exchanging instructions and data) with the DUT 14 via another control signal interface 103d. The instructions for the programs needed to control the DUT 14 during testing can be stored internally or externally in separate memory circuitry 104, accessible via a memory interface 105. These programs (e.g., DUT control instructions and signal parameter values) can be pre-programmed into the DUT controller 102 or memory 104, or can be provided by the tester 12 (e.g., from the tester controller 12c), or provided by the external controller 16 directly to the memory 104 via another memory interface 117m.

Initiation of the testing of the DUT 14 normally begins with the tester 12 instructing the DUT controller 102 to configure the DUT 14 for the testing sequence to be performed. In response, the DUT controller 102 accesses the appropriate program and provides the instructions and parameter data needed for such tests. Alternatively, the external controller 16 can instruct the DUT controller 102, via a control interface 117c, to configure the DUT 14 for testing.

Following reception of a start signal from the tester 12 via its interface 103t, the DUT controller 102 instructs the DUT 14 to initiate a sequence of sending or receiving data packets until a predetermined number of data packets has been sent by the DUT 14, or until the tester 12 informs the DUT controller 102 that testing operations have been completed (e.g., the tester 12 has transmitted all data packets required for the current test).

For example, in cases of a DUT TX signal measurement, the tester 12 would capture data packets transmitted from the DUT 14, and when the desired data packets have been captured by the tester 12 it would signal the DUT controller 102 to terminate data packet transmission by the DUT 14 and proceed to the next test operation. Similarly, in the case of a DUT RX test, the tester 12 would signal the DUT 14, via the DUT controller 102, to begin receiving data packets via the signal path 13, and when the desired number of data packets have been transmitted by the tester 12 to the DUT 14, the tester 12 can instruct the DUT controller 102 to proceed to the next DUT test operation. Additionally, as needed, the DUT controller 102 can signal its readiness to the tester 12 via their signal interface 103t. Hence, as can be seen by these examples, multiple data packets can be transmitted and received by the tester 12 and DUT 14 with a single command from the external controller 16 and a start signal from the tester 12. As a result, communication and test flow control from the external controller 16 can be avoided and the tester 12 can control the flow of test operations based on pre-programmed test programs stored within and executed by the dedicated DUT controller 102.

Figure 3:
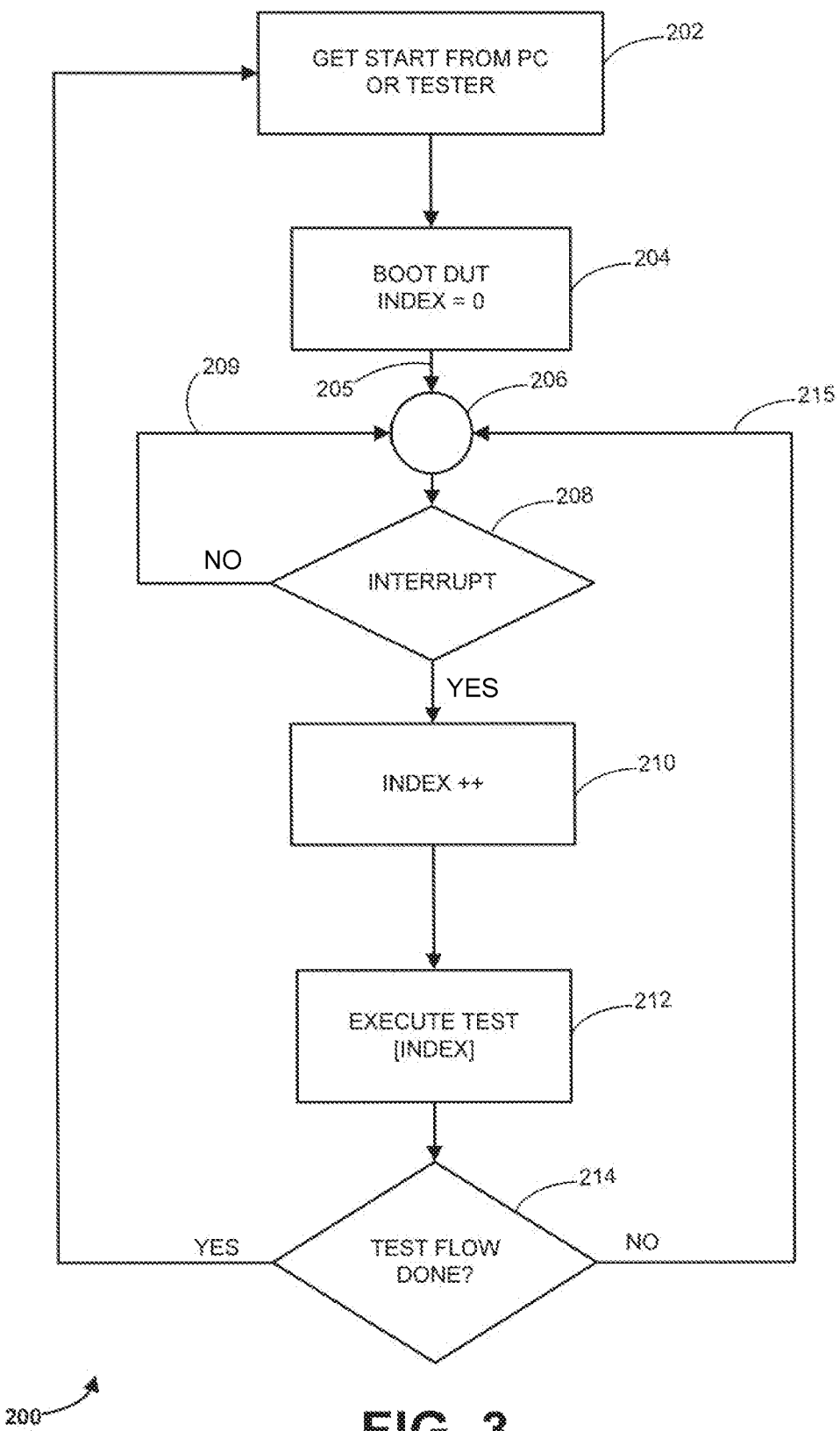
FIG. 3 depicts a test program flow in accordance with exemplary embodiments of the presently claimed invention.

Referring to FIG. 3, in accordance with an exemplary embodiment, the program flow for testing using the environment of FIG. 2 can proceed as follows. Following a start command 202 from the external controller 16 or tester 12, the DUT controller 102 and DUT 14 are initialized, or "booted", 204. In the absence of the occurrence of an interrupt 209 (e.g., in the form of a command, request, or other type of signal from the tester 12), with the program index at zero, program flow 205 proceeds to determine whether or interrupt has occurred 208. If no interrupt has occurred 209, this step of checking for an interrupt 208 repeats until it is determined that an interrupt has occurred.

Program flow then continues to the next step where the index is incremented 210, following which the next test command is executed 212 in accordance with the index value. Following this, it is determined whether the test flow has been completed 214. If not 215, the process of checking for interrupt 208, incrementing the index 210 and executing the next test command 212 is repeated. If test flow has been completed, then test flow reverts to the beginning, to await the next start command 202.

As a further alternative, the subsystem 102, 104 elements can be included as part of (e.g., internal to) the DUT 14. For example, the controller 102 and memory 104 can be elements within the DUT 14 that, while providing functionality for the DUT 14 during its normal use, also provide functionality specific for and dedicated to the testing operations as set forth above. Still further alternatives include testing environments in which the tester 12 issues multiple types of commands, and in which the DUT 14 transmits signals (e.g., either self-initiated or in response to signals from the tester 12).

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a system for testing data packet signal transceiver device under test (DUT), comprising:
    a data packet signal path for communicating with a DUT to convey a transmit data packet signal from said DUT and a receive data packet signal to said DUT;
    an external command source to provide one or more test commands related to said transit data packet signal;
    a tester coupled to said external command source and said data packet signal path to receive said transmit data packet signal and provide said receive data packet signal, and responsive to said one or more test commands by providing one or more test control signals;
    a DUT control signal interface for communicating with said DUT to convey at least one DUT control signal to said DUT; and
    DUT control circuitry coupled between said external command source, said tester and said DUT control signal interface, and responsive to at least one of
        said one or more test control signals, and
        said one or more test commands,
    by performing at least one of
        executing a plurality of test program operations to provide said at least one DUT control signal,
        providing another DUT control signal to initiate transmission of said transmit data packet signal from said DUT,
        providing another DUT control signal to terminate transmission of said transmit data packet signal from said DUT, and
        providing another DUT control signal to initiate reception of said receive data packet signal to said DUT;
    wherein said external command source provides said one or more test commands to enable testing of said DUT, following which
        said tester, responsive to said one or more test commands, provides said one or more test control signals, and
        said DUT control circuitry, responsive to at least one of said one or more test control signals and said one or more test commands, controls said testing of said DUT by performing at least one of said executing and providing steps.

2. The apparatus of claim 1, wherein said data packet signal path comprises a conductive radio frequency (RF) signal path.

3. The apparatus of claim 1, wherein said DUT control signal interface comprises a plurality of electrical signal conductors.

4. The apparatus of claim 1, wherein said DUT control circuitry comprises processing circuitry and memory circuitry responsive to said at least said one or more test control signals by:
    accessing a plurality of test program instructions from said memory circuitry; and
    executing said plurality of test program instructions with said processing circuitry.

5. The apparatus of claim 4, wherein said processing circuitry comprises microcontroller circuitry.

6. The apparatus of claim 1, wherein said DUT control circuitry comprises processing circuitry responsive to said at least said one or more test control signals by:
    accessing a plurality of test program instructions from said external instruction source; and
    executing said plurality of test program instructions with said processing circuitry.

7. The apparatus of claim 6, wherein said processing circuitry comprises microcontroller circuitry.

8. The apparatus of claim 1, wherein:
    said DUT control signal interface is further for communicating with said DUT to convey at least one test response signal from said DUT; and
    said DUT control circuitry is further responsive to said at least one test response signal by terminating said executing of said plurality of test program instructions.

9. A method of testing a data packet signal transceiver device under test (DUT), comprising:
    receiving, with a tester, a transmit data packet signal from a DUT;
    transmitting, with said tester, a receive data packet signal to said DUT;
    receiving, from an external command source, one or more test commands related to said transmit data packed signal;
    responding, with said tester, to said one or more test commands by providing one or more test control signals; and
    responding, with DUT control circuitry, to at least one of
        said one or more test control signals and
        said one or more test commands,
    by performing at least one of
        executing a plurality of test program operations to provide at least one DUT control signal to said DUT,
        providing another DUT control signal to initiate transmission of said transmit data packet signal from said DUT,
        providing another DUT control signal to terminate transmission of said transmit data packet signal from said DUT, and
        providing another DUT control signal to initiate reception of said receive data packet signal to said DUT;
    wherein said one or more test commands enable testing of said DUT, following which
        said tester, responsive to said one or more test commands, provides said one or more test control signals, and
        said DUT control circuitry, responsive to at least one of said one or more test control signals and said one or more test commands, controls said testing of said DUT by performing at least one of said executing and providing steps.

10. The method of claim 9, wherein said responding, with DUT control circuitry, to at least said one or more test control signals by executing a plurality of test program operations to provide at least one DUT control signal to said DUT comprises:

accessing a plurality of test program instructions from a local instruction source; and executing said plurality of test program instructions.

11. The method of claim 10, wherein said executing said plurality of test program instructions comprises executing said plurality of test program instructions with microcontroller circuitry.

12. The method of claim 9, wherein said responding, with DUT control circuitry, to at least said one or more test control signals by executing a plurality of test program operations to provide at least one DUT control signal to said DUT comprises:

accessing a plurality of test program instructions from said external instruction source; and executing said plurality of test program instructions.

13. The method of claim 12, wherein said executing said plurality of test program instructions comprises executing said plurality of test program instructions with microcontroller circuitry.

14. The method of claim 9, further comprising receiving, with said DUT control circuitry, at least one test response signal from said DUT and in response thereto terminating said executing of said plurality of test program instructions.

* * * * *